United States Patent [19]

Campisi et al.

[11] Patent Number: 4,817,272
[45] Date of Patent: Apr. 4, 1989

[54] LEAD CRIMPING APPARATUS

[75] Inventors: Carl Campisi, Chicago, Ill.; Andrew Kaliszek, Phoenix, Ariz.; Elmer M. Klein, Mundelein, Ill.; Richard G. Schmid, Glenview, Ill.; Thomas J. Bradfish, West Chester, Ill.

[73] Assignee: Zenith Electronics Corporation, Glenview, Ill.

[21] Appl. No.: 87,009

[22] Filed: Aug. 18, 1987

[51] Int. Cl.$^4$ .............................................. B23P 19/04
[52] U.S. Cl. ........................................ 29/741; 29/565; 29/838
[58] Field of Search .............. 29/741, 739, 33 M, 565, 29/564.1, 832, 838, 839; 140/93 D, 105

[56] References Cited

U.S. PATENT DOCUMENTS 3,429,170  2/1969  Romeo ................................. 29/741
4,557,043 12/1985  Starski ................................. 29/741

FOREIGN PATENT DOCUMENTS 1018278 1/1966 United Kingdom .................. 29/838
2186825 8/1987 United Kingdom ................ 140/105

OTHER PUBLICATIONS

Scherb, Jr., W. R., "Lead Cutting and Bending Apparatus," Western Electric Technical Digest, No. 50, Apr., 1978, p. 27.
Beam, W. D., "Tool for Stubbing Pins Preassembled in a Substrate," Western Electric Tech. Digest, No. 66, Apr., 1982, p. 3.

Primary Examiner—P. W. Echols

[57] ABSTRACT

An electronic component lead or tab crimping apparatus adapted for use with a conveyor system in the assembly of printed circuit (PC) boards includes an upper assembly having an upper interchangeable plate and a lower actuator plate and further includes a pneumatically actuated lower assembly. The interchangeable plate includes a plurality of spaced apertures within each of which is disposed a lead/tab engaging, crimping element. The upper assembly is initially displaced upward by the pneumatically actuated lower assembly to a position in close proximity to and in alignment with the lower surface of a PC board such that each of the crimping elements is disposed in close proximity to a lead, or leads (or tabs), of an electronic component positioned on the PC board. The lower assembly then displaces the actuator plate upward by cam action such that the actuator plate simultaneously engages and pivotally displaces the crimping elements resulting in crimping of the electronic component leads or tabs. The actuator plate of the upper assembly is then lowered by the lower assembly allowing for disengagement of the leads/tabs by the crimping elements, followed by further lowering of the upper assembly by the lower assembly to permit the PC board with crimped leads/tabs to be displaced by the conveyor system and another PC board to be moved in position for lead/tab crimping.

46 Claims, 8 Drawing Sheets

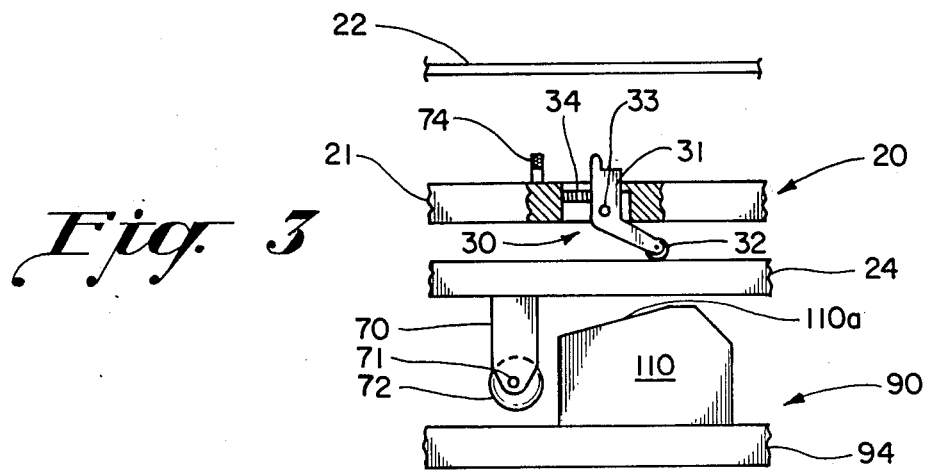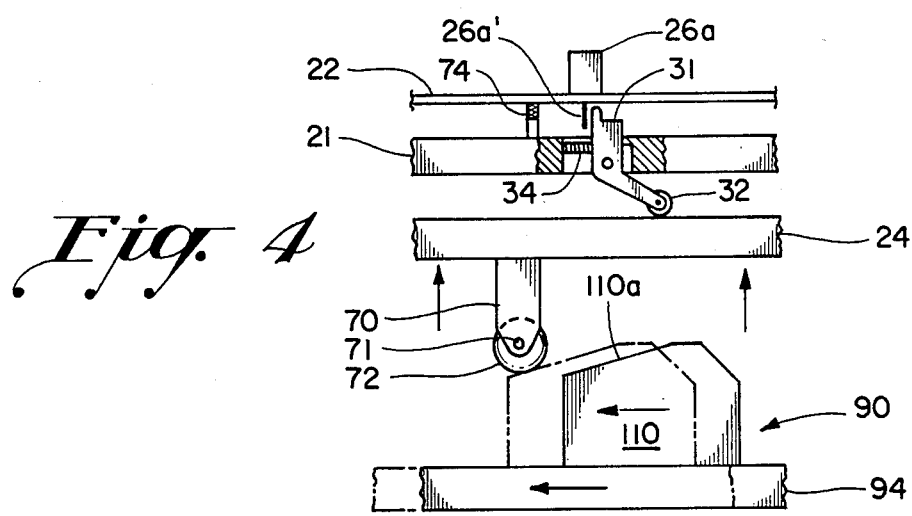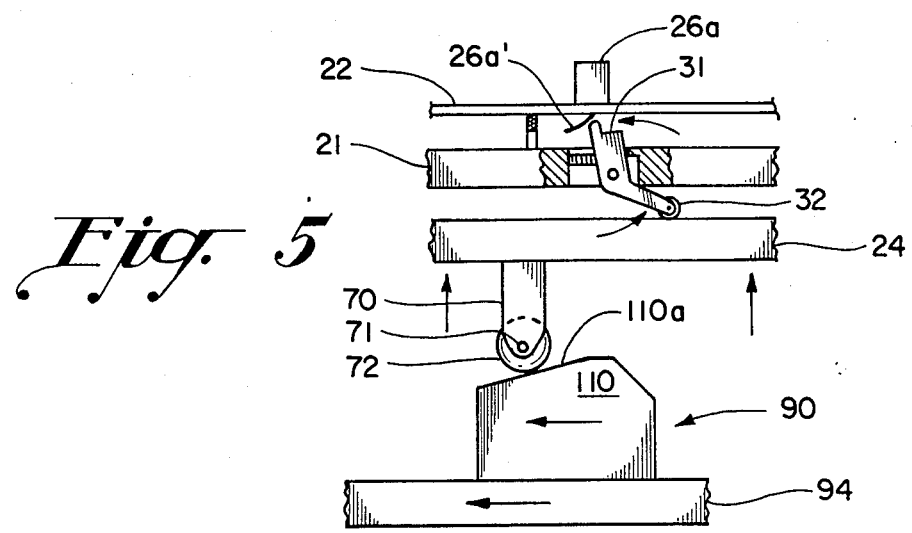

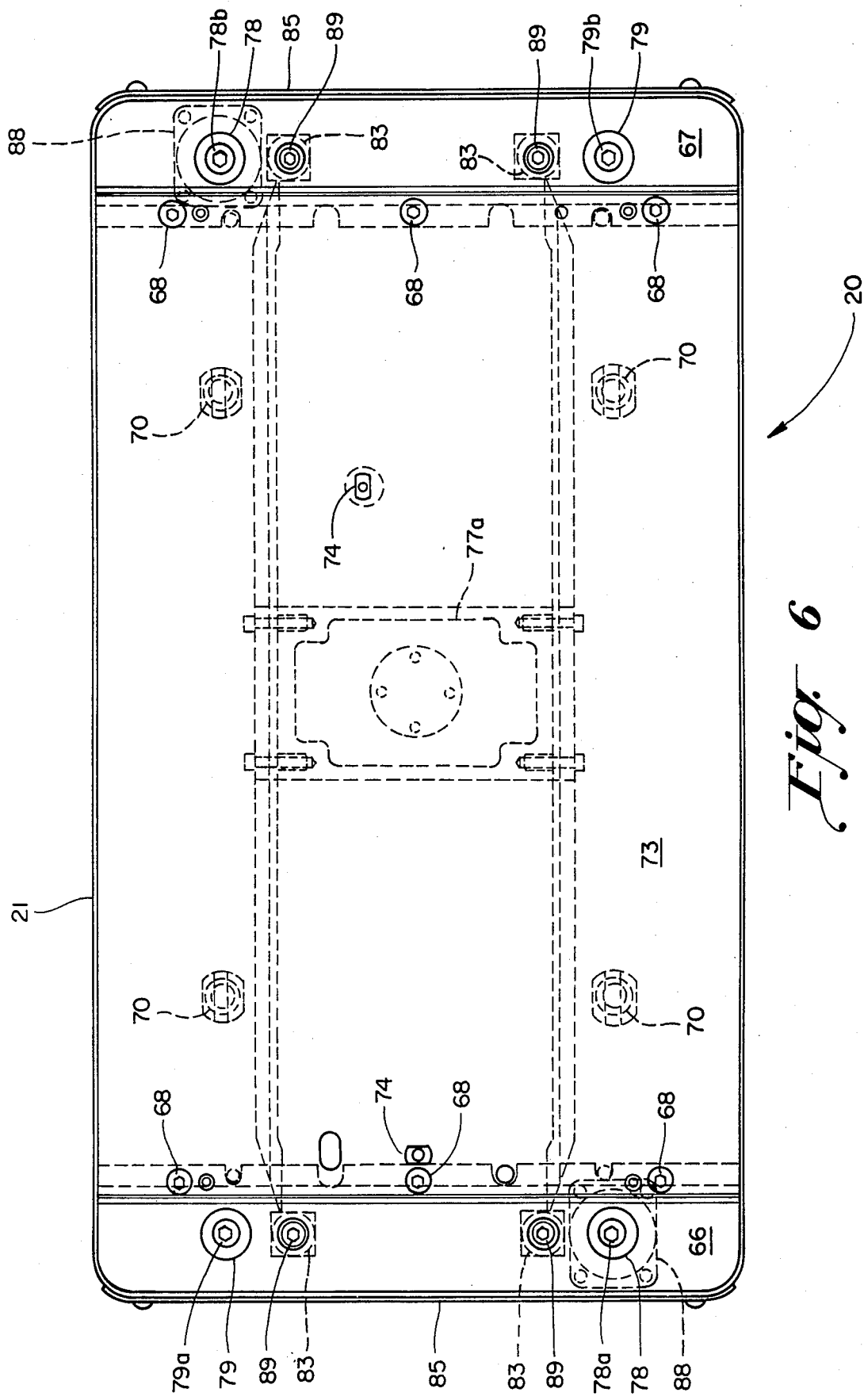

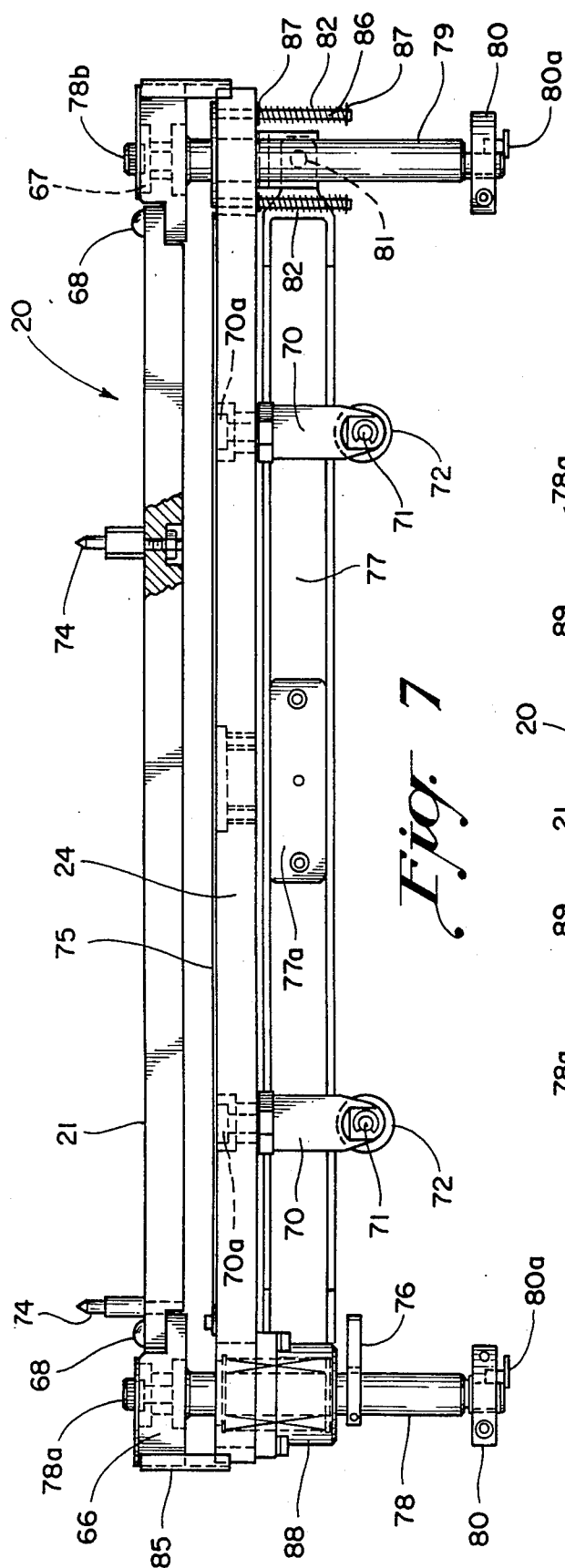
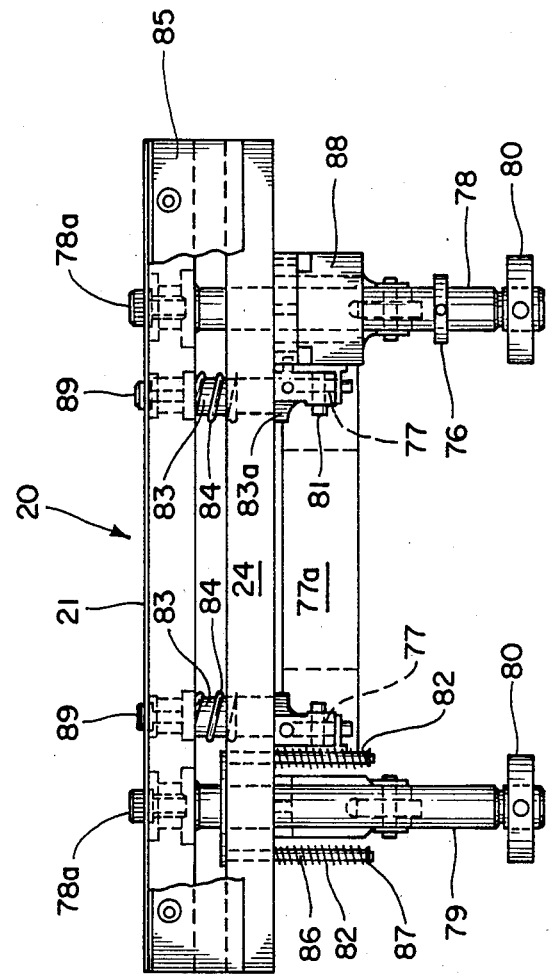
Fig. 7
Fig. 8

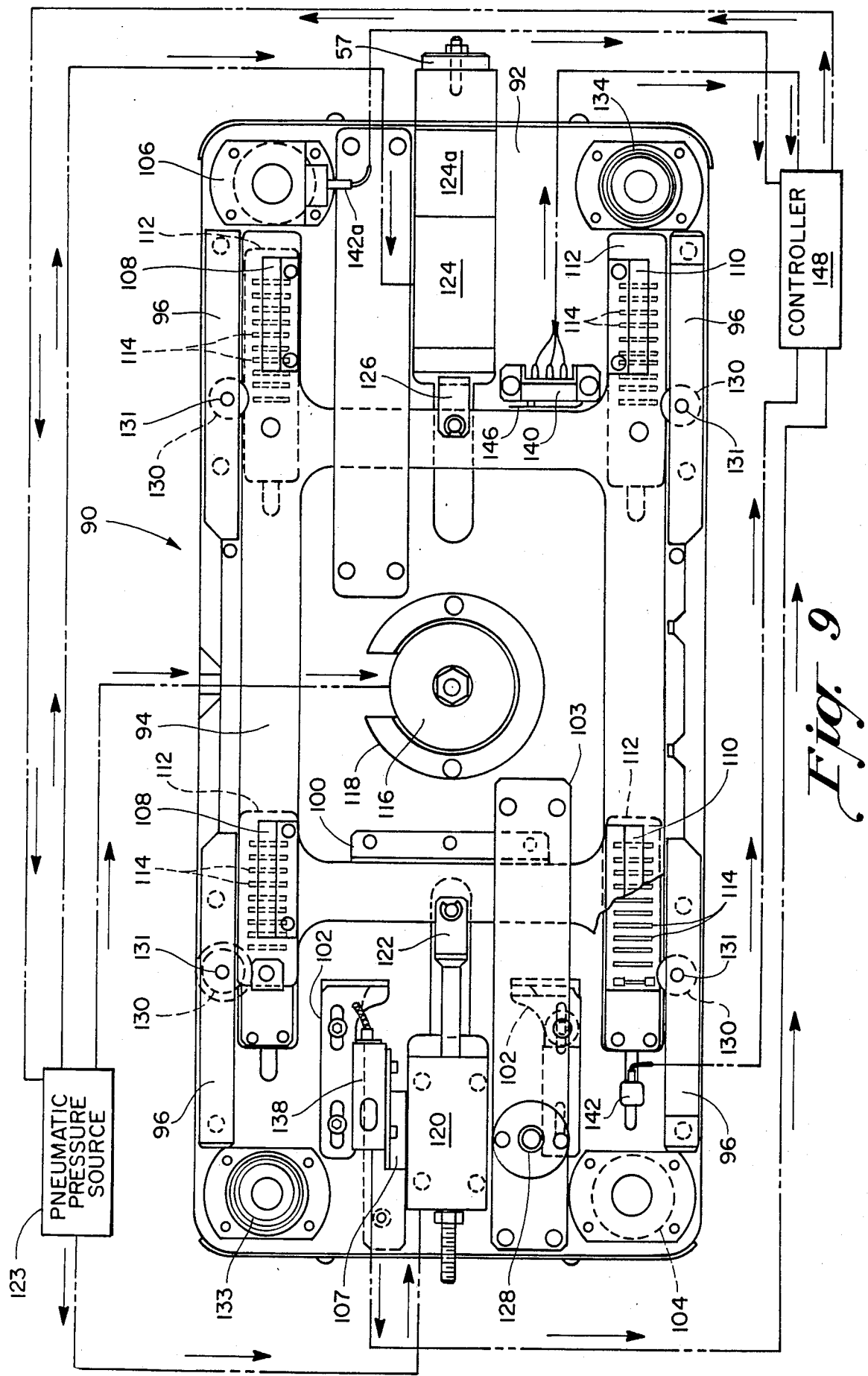

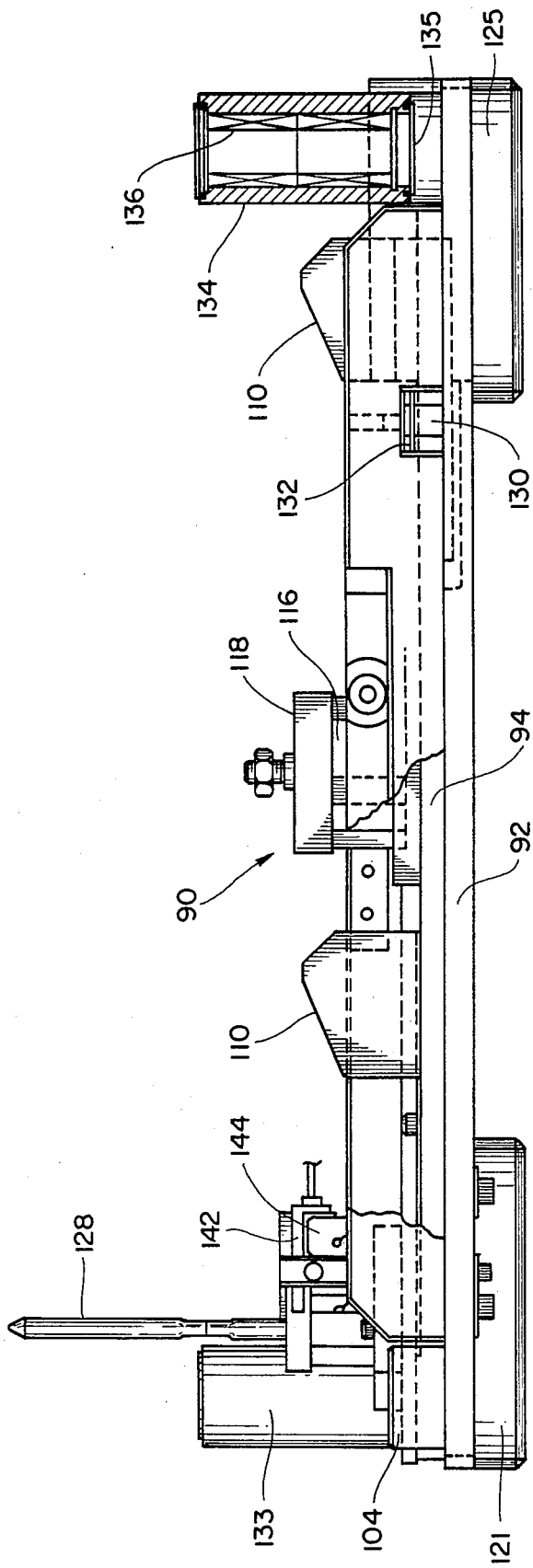
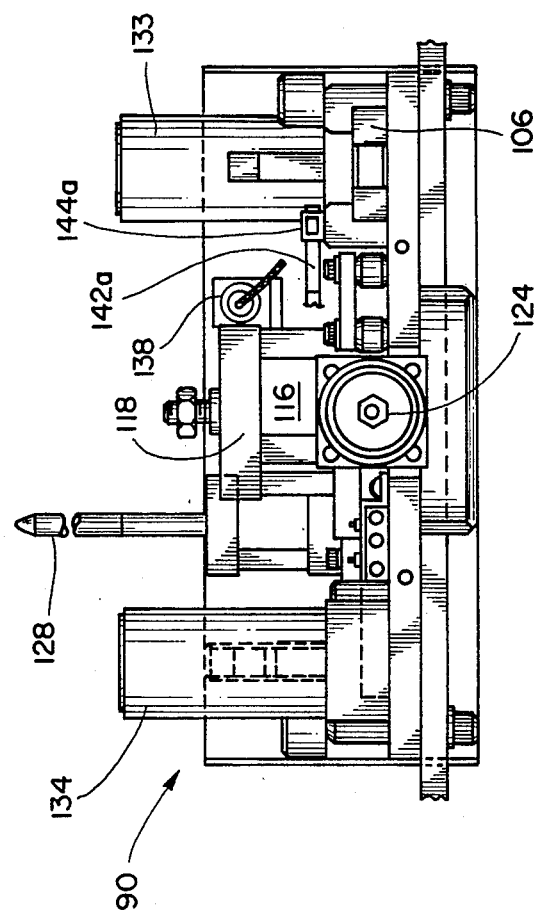

LEAD CRIMPING APPARATUS

BACKGROUND OF THE INVENTION

This invention relates generally to the assembly of printed circuit (PC) boards and is particularly directed to the crimping of leads or tabs of electronic components inserted through apertures in a PC board.

PC boards may include many different kinds of components, such as resistors, transistors, capacitors, potentiometers, coils and others. During fabrication, the PC board is formed with apertures which are adapted to receive the leads and tabs of various of the aforementioned components. With the leads of these components inserted through the aforementioned apertures in the PC board, electrical contact is established between these leads and various conductors on the PC board by bending these leads so that they are in intimate contact with one or more conductors. The bending of these electronic component leads is termed "crimping." Component tabs are similarly inserted through PC board apertures for the purpose of mounting the component to the PC board. In the following discussion and description and for purposes of the present invention, the terms electronic component leads and tabs are used interchangeably and are considered to be equivalent structures.

The fabrication and assembly of PC boards is increasingly being accomplished using high speed, automatic machines and methods. This approach generally makes use of robotic machines which insert the various electronic components on the PC board and then crimp the electronic component leads in electrical contact with various electrical conductors on the PC board. Each of the PC boards is positioned in sequence with respect to these robotic machines by means of a high speed conveyor system which facilitates the rapid assembly of the PC boards.

Prior art approaches in the high speed, automatic crimping of electronic component leads inserted through a PC board have suffered from being overly complex resulting in high costs and low reliability of these installations. For example, where a large number of crimping elements are used to crimp a corresponding large number of electronic component leads, each crimping element has associated therewith a respective actuating mechanism. This not only increases the number of crimping components involved, but also requires that precise alignment between each actuating mechanism and its associated crimping element be maintained. Furthermore, a large space is generally required to accommodate the large number of actuating mechanisms making this approach difficult to integrate into a PC board conveyor system where component insertion and lead crimping is accomplished by operator controlled apparatus. These large, bulky installations make operator positioning adjacent to the conveyor system difficult and inhibit direct viewing of the PC boards and electronic components installed thereon which the operator must have to exert proper control over the assembly process.

Because of the large variety of PC boards and combinations of electronic components positioned thereon, a PC board conveyor system must be capable of accommodating the assembly of various PC boards. To accommodate the various configurations of different PC boards as well as the arrangement of electronic components thereron, those components of the PC board assembly system involved with crimping of component leads must be matched to the configuration of the PC boards being assembled. The prior art has required not only the replacement of the individual lead crimping elements, but also each of their associated actuating mechanisms when the conveyor system is modified to accommodate another PC board configuration. This not only increases the complexity and cost of the PC board assembly system as well as the time to change over from one PC board configuration to another, but also reduces its adaptability to accommodate a wide range of PC board configurations. In addition, current lead crimping arrangements in PC board assembly conveyor systems incorporate various structures on the crimping assembly which limit the locations on the PC board at which electronic component leads can be crimped. The arrangement and configuration of the electronic components installed on the PC board is thus restricted to those component positioning and spacing arrangments which can be accommodated by the crimping mechanism taking into consideration the structures disposed thereon.

The present invention is intended to overcome the aforementioned limitations of the prior art by providing an improved electronic component lead crimping apparatus which employs a common actuator means for actuating each of a plurality of crimping elements which may be arranged in virtually any spaced array to accommodate virtually any positioning arrangement of electronic components on the PC board. The lead crimping apparatus of the present invention is comprised of a relatively small number of components and occupies a small space, and is easily positioned immediately beneath a PC board conveyor system while still allowing for the legs of a conveyor system operator to also be positioned beneath the conveyor. Electronic component leads are engaged by the individual crimping elements as the crimping element is displaced generally parallel to the plane of the PC board in an arrangement which does not require precise alignment between the component lead and the crimping element. The lead crimping apparatus is capable of accommodating virtually any arrangement of electronic components on a PC board and is adapted for ease of interchangeability of those components which must be matched to the electronic component array on the PC board.

OBJECTS OF THE INVENTION

Accordingly, it is an object of the present invention to provide an improved arrangement for the automatic crimping of the leads of electronic components positioned on a PC board.

It is another object of the present invention to provide for more reliable, faster and more accurate crimping of electronic component leads in a conveyor-type PC board assembly system.

A further object of the present invention is to provide a common actuator means for a plurality of electronic component lead crimping elements in the assembly and fabrication of PC boards.

A still further object of the present invention is to provide an electronic component lead crimping system capable of accommodating virtually any arrangement of electronic components and component leads on a PC board.

Yet another object of the present invention is to provide an electronic component lead crimping system which can be easily adapted, by replacing a single element, to accommodate virtually any layout of electronic components on a PC board.

Another object of the present invention is to provide an automatic electronic component lead crimping arrangement which is particularly adapted for use with a conveyor-type of PC board transport and assembly system.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIGS. 3, 4 and 5 illustrate the operation of one arrangement of the crimping elements illustrated in FIGS. 1 and 2 as an example of the crimping of the leads of an electronic component positioned upon a PC board in accordance with the present invention;

FIG. 6 is a top plan view shown partially in phantom of the actuator means for the electronic component lead clinching elements used in the present invention;

FIG. 7 is a side view of the clinching element actuator means illustrated in FIG. 6;

FIG. 8 is an end-on view of the clinching element actuator means illustrated in FIG. 6;

FIG. 9 is a top plan view of the pneumatically actuated lower assembly of the lead crimping apparatus of the present invention shown partially in phantom;

FIG. 10 is a side view of the lower assembly of the lead crimping apparatus illustrated in FIG. 9;

FIG. 11 is an end-on view of the lower assembly of the lead crimping apparatus illustrated in FIG. 9.

DETAILED DESCRIPTION OF THE PREFERRED EMBODIMENT

Figure 1:
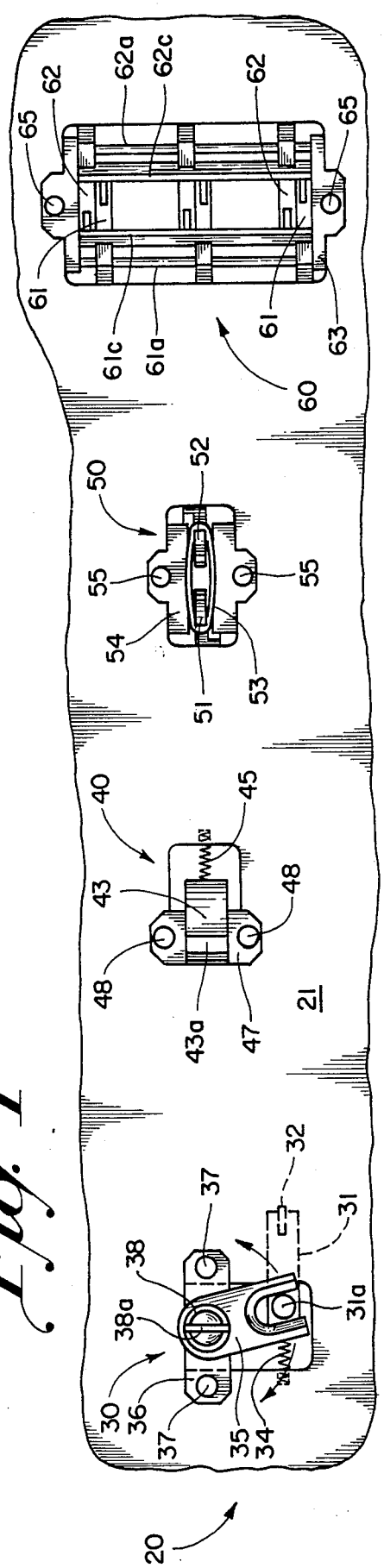
FIG. 1 is a top plan view of a portion of an electronic component lead crimping apparatus in accordance with the present invention illustrating various crimping elements utilized therein.
Figure 2:
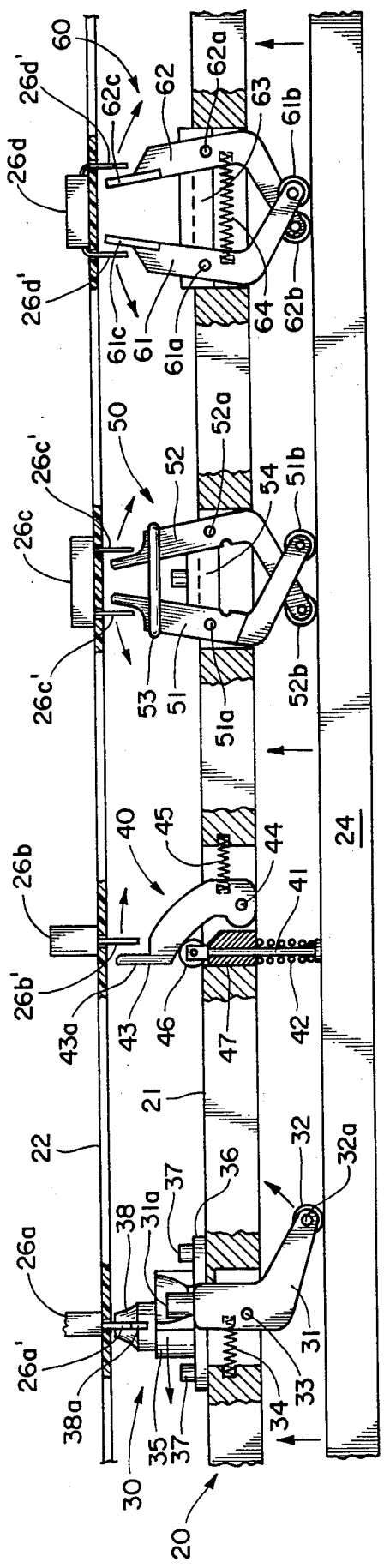
FIG. 2 is a lateral view of the portion of the electronic component lead crimping apparatus illustrated in FIG. 1 which further shows a PC board positioned adjacent thereto as well as a portion of the crimping element actuator means.

Referring to FIGS. 1 and 2 there are respectively shown top plan and side views of a portion of the lead crimping apparatus of the present invention.

Illustrated in FIGS. 1 and 2 is a portion of the upper assembly 20 of the lead crimping apparatus. The upper assembly 20 is adapted for positioning immediately beneath a PC board 22 having a plurality of apertures, or slots, therein. Each of the slots is adapted to receive a respective lead of an electronic component positioned on the PC board 22. As shown in FIG. 2, a plurality of electronic components 26a, 26b, 26c and 26d are positioned on an upper surface of the PC board 22. Each of these electronic components 26a, 26b, 26c and 26d has one or more leads 26a', 26b', 26c' and 26d', respectively, extending downward from the component and through an aperture in the PC board 22.

The upper assembly 20 includes an interchangeable plate 21 having a plurality of apertures therein, within each of which is positioned a crimping mechanism. Thus, first, second, third and fourth crimping mechanisms 30, 40, 50 and 60 are positioned within respective apertures within the interchangeable plate 21. Each of these crimping mechanisms includes a crimping element pivotally displaceable in respone to the upward movement of an actuator plate 24 for crimping one or more leads of an electronic component. The actuator plate 24 forms a portion of the upper assembly 20 and is positioned immediately below the interchangeable plate 21. The interchangeable and actuator plates 21, 24 are preferably comprised of metal, e.g., aluminum. The operation and configuration of the upper assembly 20 is described in detail below.

The first clamping mechanism 30 is comprised of a dogleg-shaped pivot arm 31 coupled to the interchangeable plate 21 and maintained within an aperture therein by means of the combination of a mounting bracket 36 and a pivot pin or bearing shaft 33. The mounting bracket 36 is affixed to the interchangeable plate 21 by means of a pair of threaded mounting pins 37. An upper end of the pivot arm 31 is provided with rod-like member 31a, while coupled to a lower end of the pivot arm by means of a bearing shaft 32a is a roller or bearing 32. A compressible, coiled spring 34 is positioned between the pivot arm 31 and an inner edge of the interchangeable plate 21 defining a portion of the aperture therein in which the first crimping mechanism 30 is positioned. Respective ends of the spring 34 are positioned within facing slots within the pivot arm 31 and the interchangeable plate 21 to maintain the spring in position. Pivotally coupled to the mounting bracket 36 is a crimping element 35. The crimping element 35 includes a slot within which is positioned the rod-like upper end portion 31a of the pivot arm 31. The crimping element 35 further includes an upper lead engaging portion 38 having a slot 38a therein. With the electronic component 26a positioned on the PC board 22 and its flat lead 26a' extending through an aperture therein, this lead is positioned in the slot 38a within the crimping element 35. Upward displacement of the actuator plate 24 results in counterclockwise rotation of the pivot arm 31, as viewed in FIG. 2, about the bearing shaft 33 causing clockwise rotation of the crimping element 35, as viewed in FIG. 1, about a generally vertical axis extending through the lead engaging portion 38 of the crimping element. With the electronic component lead 26a' positioned within the slot 38a of the lead engaging portion 38 of the crimping element 35, rotation of the crimping element will result in rotational displacement of the lower portion of the lead and electrical coupling between the lead and a conductor positioned on the lower surface of the PC board 22 immediately adjacent to the aperture through which the lead extends. The first crimping mechanism 30 thus effects rotational crimping of an electronic component lead.

The second crimping mechanism 40 also includes a pivot arm 43 pivotally coupled to and positioned within an aperture in the interchangeable plate 21 by means of the combination of a mounting bracket 47 and a bearing shaft 44. The mounting bracket 47 is securely mounted to the interchangeable plate by a pair of threaded coupling pins 48. A compressible, coiled spring 45 positioned in abutting contact with and between the pivot arm 43 and an edge of the interchangeable plate 21 defining a portion of the aperture within which the pivot arm is positioned urges the pivot arm in counterclockwise rotation about the bearing shaft 44 as viewed in FIG. 2. An upper end 43a of the pivot pin 43 is adapted for engagement with and displacement of the lead 26b' extending downward from the electronic component 26b for effecting crimping of this lead. The second crimping mechanism 40 further includes a shaft-like plunger element 41 having a lower end which is adapted for engagement with the actuator plate 24 and an upper end having a bearing 46 rotationally mounted thereto. The plunger element 41 is positioned within an aperture in the mounting bracket 47 and is freely displaceable therein along its length. A coil spring 42 positioned about a lower portion of the plunger element 41 and disposed between and in abutting contact with the lower surface of the mounting bracket 47 and the lower end of the plunger element urges the plunger element downward in a retracted position. Upward displacement of the actuator plate 24 causes the plunger element 21 to move upward and its bearing 46 to engage and pivotally displace the pivot arm 43 so that its upper end portion 43a engages and crimps lead 26b' of electronic component 26b.

The third crimping mechanism 50 includes first and second pivot arms 51 and 52 which are each respectively maintained in position while a slot in the interchangeable plate 21 by means of respective combinations of bearing shafts 51a and 52a and a mounting bracket 54. Mounting bracket 54 is coupled to the interchangeable plate 21 by means of a pair of threaded mounting pins 55. The bearing shafts 51a and 52a are positioned within the mounting bracket 54. The lower end of the first pivot arm 51 is provided with a bearing 51b, while another bearing 52b is attached to a lower end of the second pivot arm 52. Respective upper ends of the first and second pivot arms 51, 52 are adapted for engaging and displacing outward a respective one of the leads 26c' extending downward from electronic component 26c and through respective apertures in the PC board 22. A stretchable, resilient band 53 is positioned about the upper ends of the first and second pivot arms 51, 52 and urges these ends of the pivot arms toward one another. Upward displacement of the actuator plate 24 causes displacement of the lower and upper ends of the first and second pivot arms 51, 52 away from one another and crimping of the leads 26c'. When the actuator plate 24 is subsequently lowered, the respective upper and lower ends of the first and second pivot arms 51, 52 are urged toward each other by the resilient band 53 so as to maintain their relative positions as shown in FIG. 2. By configuring the first and second pivot arms 51, 52 such that the upper end of the first pivot arm 51 is positioned to the right of the upper end of the second pivot arm 52, upward displacement of the actuator plate 24 will cause the respective upper ends of the two pivot arms to be displaced toward one another. In this manner, the leads of an electronic component may be urged together resulting in crimping of these leads immediately beneath the electronic component on the facing surface of the PC board 22.

The fourth crimping mechanism 60 is particularly adapted for crimping a dual-in-line (DIP) integrated circuit 26d having first and second linear arrays of leads 26d' extending therefrom. The fourth crimping mechanism 60 includes first and second pivot arms 61, 62 each respectively coupled to a mounting bracket 63 by means of bearing shafts 61a and 62a. The mounting bracket 63 is positioned within an aperture within the interchangeable plate 21 and is mounted thereto by means of a pair of mounting pins 65. First and second pivot arms 61 and 62 are respectively provided with upper lead engaging ends 61c, 62c, while to the lower ends thereof are respectively mounted bearings 61b and 62b. A coil spring 64 is positioned between and in abutting contact with the first and second pivot arms 61, 62. Under compression, spring 64 urges the upper and lower ends of the first and second pivot arms 61, 62 toward each other. Spring 64 is maintained in position betwen and in contact with the first and second pivot arms 61, 62 by means of respective slots in facing portions thereof. As shown in FIG. 1, the upper end portions of the first and second pivot arms 61, 62 each have a generally elongated, linear configuration and are thus adapted to engage and crimp respective pluralities of linearly aligned leads 26d' extending downward from the electronic component 26d when displaced in the directions of the arrows shown in FIG. 2 upon upward displacement of the actuator plate 24.

It should be noted here that the unique configuration and interaction between each of the crimping mechanisms and the vertical displacement of the actuator plate causes the component leads to be crimped in a direction generally transverse to the length of the lead or to be rotationally displace about a fixed pivot point. This allows for lead crimping without the necessity to hold the electronic component in position from above and assures more reliable lead crimping. In addition, precise alignment between the component lead and crimping mechanism is not required as in the case where the crimping mechanism is displaced along the length of the component lead.

Referring to FIGS. 3, 4 and 5, the operation of the first crimping mechanism 30 will now be described in greater detail. Because the same principles of operation are involved in each of the four aforementioned crimping mechanisms, the following description is equally applicable to the operation of the remaining crimping mechanisms. As shown in FIG. 4, following positioning of the electronic component 26a on the PC board 22 with its lead, or leads, 26a' positioned within an aperture theerin and extending beneath the PC board, the upper assembly 20 including the interchangeable plate 21 is positioned immediately beneath the PC board. Proper spacing and alignment between the PC board 22 and the interchangeable plate 21 is provided by means of one or more locater/spacer pins 74 mounted to and extending upward from the interchangeable plate 21. The actuator plate 24 would preferably remain in contact with the pivot arm roller 32 even in its retracted or lowered position in most cases, although in some applications it might be desirable or necessary to provide separation between these components prior to the crimping action.

After the interchangeable plate 21 and actuator plate 24 are moved upward into a position as shown in FIG. 4 and as described in detail below, a pneumatically actuated lower assembly 90 is displaced leftward as shown in FIGS. 4 and 5. The lower assembly 90 includes a movable slide 94 having a plurality of cams 110, although only a single cam is shown in FIGS. 3, 4 and 5 for simplicity.

Extending downward from the lower surface of the actuator plate 24 is a cam follower shaft 70, to the lower end of which is mounted a bearing 72 by means of a bearing shaft 71. With the actuator plate 24 in contact with the bearing 32 on the lower end of the pivot arm 31, the bearing 72 on the distal end of the cam follower shaft 70 is positioned in alignment with the leading or left edge of the upper surface 110a of the cam 110 as shown in FIG. 4. Leftward displacement of the slide 94 as well as the cam 110 positioned thereon causes the upper surface of the cam to engage the bearing 72 resulting in upward displacement of the actuator plate 24 as shown by the arrows in FIGS. 4 and 5. Upward displacement of the actuator plate 24 results in counterclockwise rotational displacement of the pivot arm 31 about bearing shaft 33 causing the upper end of the pivot arm to engage and crimp the lead 26a' extending downward from electronic component 26a. It is in this manner that the actuator plate 24 is displaced upward for engaging and pivotally displacing each of the crimping mechanisms to effect crimping of the various electronic component leads extending through and downward from the PC board 22. Additional structural details as well as a further description of the operation of the upper assembly 20 as well as of the lower assembly 90 is provided in detail in the following paragraphs.

Figure 5A:
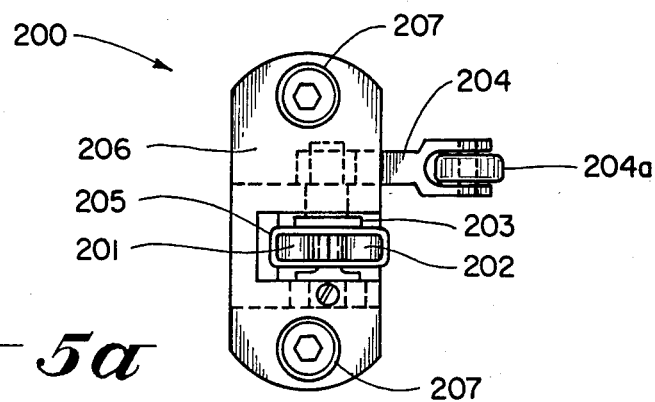
FIGS. 5a, 5b and 5c illustrate the configuration and operation of yet another crimping element embodying the principles of the present invention.
Figure 5B:
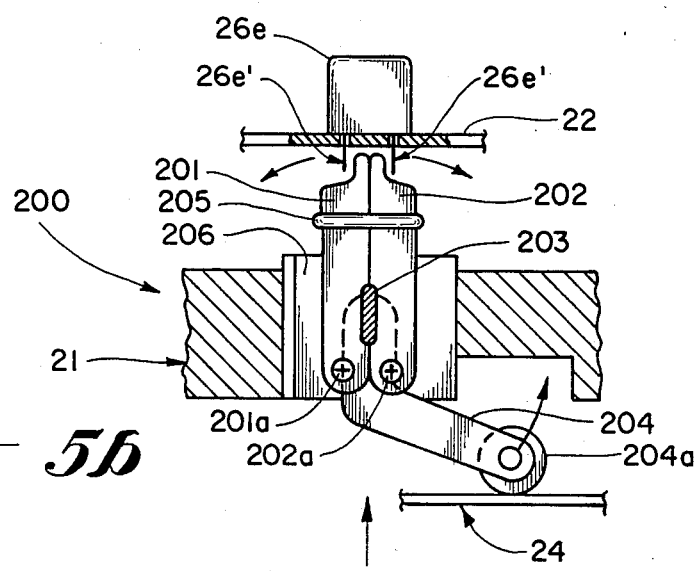
Figure 5C:
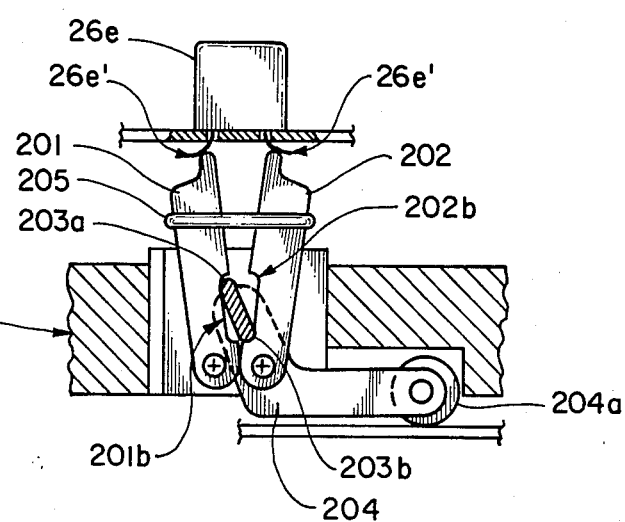

Referring to FIGS. 5a, 5b and 5c, there are shown various views of yet another crimping mechanism 200. Crimping mechanism 200 is comprises of two pivot arms 201 and 202 which rotate about their respective bearing shafts 201a and 202a. These bearing shafts 201a and 202a are positioned within and retained by a mounting bracket 206. Mounting bracket 206 is located and retained in a slot in the interchangeable plate 21 by means of a pair of screws 207. A cam-like member 203 is captivated within two cutouts 201b and 202b in the respective pivot arms 201 and 202. The cam-like member 203 rotates on its own shaft which is retained by mounting bracket 206. Attached to the shaft of the cam-like member 203 is a lever arm 204 at the lower end of which is attached a roller 204a. Crimping mechanism 200 operates in the following manner. Upon upward displacement of actuating plate 24, the roller 204a is pushed upward and lever arm 204 is forced to rotate along with cam-like member 203 to which it is attached. As a result of this rotation, the upper and lower ends 203a and 203b of the cam-like member 203 are brought into contact with surfaces 201b and 202b on pivot arms 201 and 202, respectively. This continued contact forces pivot arms 201 and 202 to swing outward simultaneously thus crimping the leads 26e' of an electronic component 26e. Upon downward displacement of actuating plate 24, the elastic band 205 attached to pivot arms 201 and 202 forces the mechanism to return to its original configuration.

Referring to FIGS. 6, 7 and 8, there are shown various views and additional details of the upper assembly 20. The upper assembly 20 includes first and second top mounting brackets 66 and 67 positioned at respective ends thereof. Coupled to and positioned between the first and second top mounting brackets 66, 67 is the interchangeable plate 21. The interchangeable plate 21 is illustrated in FIGS. 6, 7 and 8 without the various crimping elements for simplicity and is securely attached to the first and second top mounting brackets 66, 67 by means of a plurality of spaced, threaded mounting pins 68. The mounting arrangement of the interchangeable plate 21 which makes use of the threaded mounting pins 68 facilitates replacement of one interchangeable plate with another plate having a different arrangement of crimping mechanisms thereon in order to accommodate another PC board having a different arrangement of electronic components.

Mounted to respective lower portions of the first and second top mounting brackets 66, 67 are two pairs of locator rods 78 and 79. The first and second pair of locator rods 78 and 79 are positioned in opposed corners of the upper assembly 20 and are generally cylindrical in shape. The pairs of locator rods 78, 79 are respectively coupled to the first and second top mounting brackets 66, 67 by means of threaded coupling pins 78a, 78b and 79a, 79b. Attached to the lower end of each of the first and second pair of locator rods 78 and 79 is a threaded collar 80 which is maintained thereon by means of a pair of set screws and a collar retainer 80a. Also mounted to each of the first and second locator rods 78, 79 on an intermediate portion along the length thereof is a proximity sensor actuator ring 76.

Positioned immediately beneath the interchangeable plate 21 and aligned parallel therewith is an actuator plate 24. Respective opposed corners of the actuator plate 24 are each provided with a ball bearing bushing 88, within which one of the locator rods 78 is positioned. To the upper portion of the actuator plate 24 is attached to wear plate 75. A cover plate 85 is attached to each of the outer surfaces of the first and second top mounting brackets 66 and 67 and extends downward so as to be positioned adjacent to an end of the actuator plate 24. Coupled to and extending downward from the actuator plate 24 are four cam follower shafts 70. Each of the cam follower shafts 70 is securely coupled to the actuator plate by means of a threaded mounting pin 70a. To the lower end of each of the cam follower shafts 70 is attached a roller or bearing 72 by means of a bearing shaft 71. Each of the bearing shafts 71 are arranged in parallel alignment such that each of the bearings 72 rotates about an axis generally parallel with the plane of the actuator plate 24 and perpendicular to the longitudinal axis of the actuator plate.

A pair of beams 77 are positioned immediately beneath the actuator plate 24 adjacent to respective lateral edges thereof and are aligned along the length of the actuator plate. Each end of the beam 77 is coupled to a cross beam mounting shaft 83 by means of a round pin 81. Each of the cross beam mounting shafts 83 extends upward from a respective round pin 81 and is positioned within a slot in the actuator plate 24.

The upper ends of the cross beam mounting shafts 83 are securely attached to one of the top mounting brackets 66, 67 by means of threaded coupling pins 89. A coiled spring 84 is positioned about each of the cross beam mounting shafts 83 and along a portion of the length thereof. Respective ends of each of the coiled springs 84 are positioned in abutting contact with one ot the top mounting brackets 66, 67 and with the actuator plate 24. The arrangement of the locator rods 78, the ball bearing bushings 88, and coiled springs 84, maintains the actuator plate 24 in alignment with the first and second top mounting brackets 66, 67 as well as with the interchangeable plate 21. The coiled springs 84 coupled between the combination of the top mounting brackets 66, 67 and interchangeable plate 21 and the actuator plate 24 urge the interchangeable and actuator plates apart and force the actuator plate to rest on flanges 83a of the cross beam mounting shafts 83.

Referring to FIGS. 9, 10 and 11, the configuration and operation of the lower assembly 90 now will be described. The lower assembly 90 includes a generally planar, rectangular base plate 92. Attached to the upper surface of the base plate 92 adjacent respective, opposed corners thereof are first and second rod limiters 104, 106. Also positioned on the upper surface of the base plate 92 adjacent to opposed corners thereof are first and second cylindrically shaped main bearing bushings 133 and 134. Each of the first and second main bearing bushings 133, 134 has a slot therein extending substantially the length thereof. Within each of the slots of the first and second main bearing bushings 133, 134 is positioned a ball bearing 136. The first and second main bearing bushing 133, 134 are respectively adapted to receive in sliding engagement the pair of locator rods 79 attached to and extending downward from the first and second mounting brackets 66, 67 on the upper assembly 20.

Also positioned on the upper surface of the base plate 92 is a slide 94. The slide 94 is adapted for sliding displacement on the upper surface of the base plate 92 in the direction of the longitudinal axis of the base plate. One of a plurality of roller bearing wear plates 112 is positioned in each corner of the slide 94 on the lower surface thereof. Disposed between each of the roller bearing wear plates 112 and the immediately adjacent upper surface of the base plate 92 are a plurality of flat roller bearings 114 to facilitate linear displacement of the slide 94 on the upper surface of the base plate. Proper alignment between the base plate 92 and the slide 94 is maintained by four slide side bearings 130, each of which engages a respective lateral portion of the slide to maintain the slide in proper alignment with the base plate and facilitate its linear displacement on the base plate. Each of the slide side bearings 130 is maintained in position on the base plate 92 by means of a respective bearing shaft 131 which is positioned between and engaged by the base plate 92 and one of a plurality of elongated ribs 96 attached to respective lateral portions of the base plate. The upper flanges on the slide side bearings 130 also engage respective upper lateral edges of the slide 94 and maintain the slide in position upon the base plate 92.

Positioned on the upper surface of the slide 94 adjacent to a first lateral edge thereof are a pair of right hand cams 108. Similarly, positioned on the upper surface of and adjacent to the opposing lateral edge of the slide 94 are a pair of left hand cams 110. Each of the cams is securely mounted to the upper surface of the slide 94 by means of an appropriate bracket and threaded mounting pin combination.

Also mounted to the upper surface of the base plate 92 are first and second double acting pneumatic cylinders 120 and 124. The first double acting pneumatic cylinder 120 is coupled to a first end of the slide 94 by means of a slide cylinder clevis 122 and coupling pin combination. Similarly, the second double acting pneumatic cylinder 124 is coupled to a second, opposing end of the slide 94 by means of the combination of a slide cylinder clevis 126 and a coupling pin. Retraction of the first double acting pneumatic cylinder 120 and extension of a second double acting pneumatic cylinder 1245 causes leftward displacement of the slide 94 and the plurality of cams positioned thereon, as viewed in FIGS. 9 and 10. Similarly, extension of the first double acting pneumatic cylinder 120 and retraction of the second double acting pneumatic cylinder 124 causes rightward displacement of the slide 94 and the plurality of cams positioned thereon. Also positioned on the upper surface of the base plate 92 is a third pneumatic cylinder 116 aligned generally perpendicular to the plane of the base plate. The third pneumatic cylinder 116 is maintained in position on the base plate 92 by means of threaded mounting pins. A pneumatic tubing support 118 maintains a plurality of pneumatic hoses (not shown for simplicity) in position. As shown in simplified form by dotted lines in FIG. 9, each of the first and second double acting pneumatic cylinders 120 and 124 as well as the third pneumatic cylinder 116 is coupled to a source of pneumatic pressure 123.

Also securely mounted to the upper surface of the base plate 92 is a first slide bumper with mounting bracket 100 as well as a second pair of slide bumpers with mounting brackets 102. The first slide bumper 100 limits rightward displacement of the slide 94 as viewed in FIG. 9, while the second pair of slide bumpers 102 limits leftward displacement of the slide. Also mounted to the upper surface of the base plate 92 is a stopper mounting bracket 103 to which is attached a pneumatic cylinder from which a cylindrically shaped PC board stopper 128 extends upward.

Also mounted to the upper surface of the base plate 92 is a sensor mounting bracket 107 to which is securely attached a photosensor 138. The photosensor 138 directs a light beam upward in order to detect the presence of a PC board moved into position above the lower assembly 90 by means of the PC board conveyor system. Also mounted by means of sensor mounting brackets 144 and 144a to the upper surface of the base plate 92 are proximity sensors 142 and 142a. Each of the proximity sensors 142 and 142a detect respectively the upper and lower positions of the actuator plate of the upper assembly via a change of electromagnetic field caused by a presence of proximity sensor actuator ring 76 during operation of the electronic component lead crimping apparatus. A third miniature contact switch 146 is mounted to the upper surface of the base plate 92 by means of a switch mounting bracket 140. The miniature switch 146 senses full retraction, or full rightward displacement, of the slide 94 as viewed in FIG. 9. As shown in simplified form by dotted lines in FIG. 9, the photosensor 138, the proximity sensors 142 and 142a, and the miniature contact switch 146 are all coupled to a controller 148 and provide appropriate control inputs thereto. The controller 148, which may be conventional in design and operation using principles well known to those skilled in the art, controls operation of the electronic component lead crimping apparatus of the present invention as described in the following paragraphs.

Figure 12:
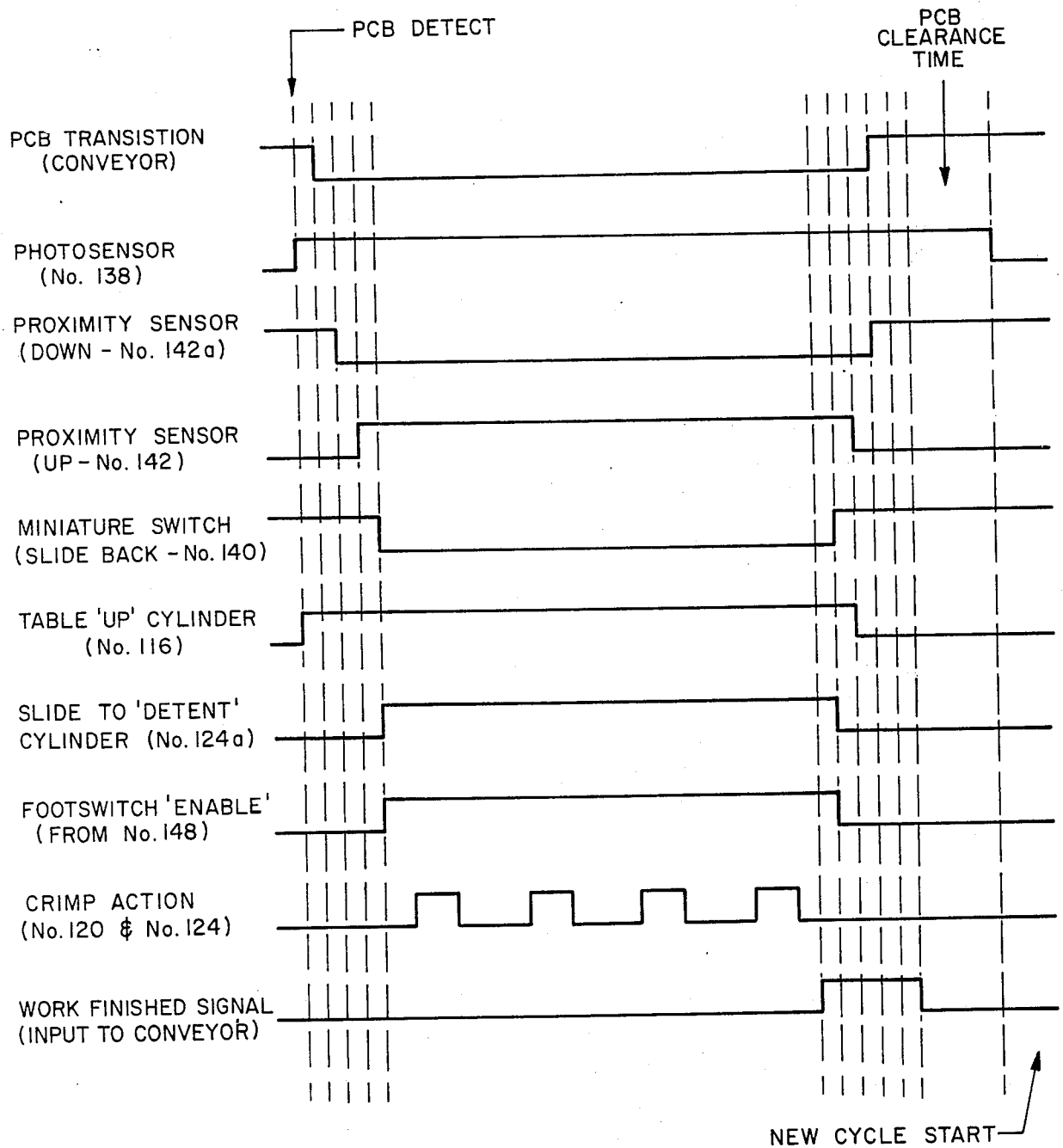
FIG. 12 is a sequence or timing chart illustrating the typical timing of the displacement of various components of a crimping apparatus and the relationship of the crimping operation relative to the PC board conveyor system.

The various components of the electronic component lead crimping apparatus described above operate in the following manner to effect lead crimping. The timed operation of various of the aforementioned components of the electronic component lead crimping apparatus is illustrated in the timing diagram of FIG. 12. Initially, a first PC board is moved by the PC board conveyor system, which is not shown in the various FIGS. for simplicity, to a position immediately above the combination of the upper and lower assemblies 20, 90. As stated above, the positioning of a PC board above the combination of the upper and lower assemblies 20, 90 is detected by the photosensor 138. With the beam coupling bracket 77a coupled to the upper end of the pneumatic cylinder 116 by means of a nut and bolt combination, extension of the pneumatic cylinder under the control of the pneumatic pressure source 123 causes the entire upper assembly 20 to be moved upward to a position beneath the PC board as shown in FIGS. 3 and 4. When the upper assembly 20 is initially displaced upward toward the PC board, the slide 94 is positioned in its retracted position, or to the right as illustrated in FIG. 9. The spacer/locator pins 74 ensure proper positioning of the PC board with respect to the upper assembly 20. Following receipt of a PC board position signal from the photosensor 138, the controller 148 provides an appropriate control signal to the pneumatic pressure source 123 for activating pneumatic cylinder 116 in displacing the upper assembly 20 to the position shown in FIGS. 3 and 4. The upraised position of the upper assembly 20 is detected by the proximity sensor 142 which provides an appropriate signal to the controller 148.

Following positioning of the upper assembly 20, including the actuator plate 24, as shown in FIGS. 3 and 4, the pneumatic pressure source 123 in response to an input from the controller 148 actuates a cylinder 124a to displace the slide 94 leftward to engage the cam rollers in assuming the crimp ready position as shown in FIG. 4. The extent of displacement of the slide 94 may be adjusted by means of a rotary travel limit knob 57 attached to the cylinder 124a for limiting its extension. Then under the control of the controller 148, the first and second double acting pneumatic cylinders 120 and 124 are activated such that the first pneumatic cylinder 120 retracts its piston arm, while the second pneumatic cylinder 124 extends its piston arm. This action by the first and second double acting pneumatic cylinders 120, 124 results in leftward displacement of the slide 94 as viewed in the various FIGS. causing each of the cams 108 and 110 to also be displaced leftward and to engage a respective bearing 72 positioned on the lower end of the cam follower shaft 70 as shown in FIG. 4. As shown in FIG. 5, leftward displacement of the various cams causes upward displacement of the actuator plate 24 which, in turn, contacts a roller 32 on the end of each of the crimping elements. This, in turn, causes rotational displacement of an associated pivot arm 31 of a crimping element effecting the crimping of an electronic component lead as shown in FIG. 5.

Following leftward displacement of the slide 94, the controller provides an appropriate control signal to the pneumatic pressure source 123 for extending the first double acting pneumatic cylinder 120 and retracting the second double acting pneumatic cylinder 124. This causes rightward displacement of the slide as viewed in the various FIGS. for allowing the actuator plate 124 to be lowered to its initial position. The actuator plate 124 is urged downward by the plurality of coiled springs 84 positioned between the interchangeable plate 21 and the actuator plate 24 as shown in FIG. 8. After the slide 94 is moved to the right as shown in FIG. 9 and its full rightward displacement is detected by the miniature switch 146, the miniature switch provides an appropriate control signal to the controller 148 which, in turn, provides a control signal to the pneumatic pressure source 123 for retracting the third pneumatic cylinder 116 and lowering the upper assembly 20 so that it assumes the position illustrated in FIG. 3. After reaching the position illustrated in FIG. 3, proximity sensor 142a allows for the engagement of the PC board conveyor system thus providing for the displacement of a PC board including one or more electronic components with leads to be crimped to be displaced beyond the lead crimping table. This allows for the initiation of another lead crimping sequence. After detection of another PC board above the upper assembly by the photosensor 138, the controller 148 outputs yet another control signal to the pneumatic pressure source 123 for extending the third pneumatic cylinder 116 in raising the upper assembly 20 to a position immediately beneath the PC board 22 as shown in FIG. 4 in initiating another lead crimping cycle.

There has thus been shown an electronic component lead crimping apparatus which provides for the simultaneous crimping of a plurality of leads of electronic components positioned in virtually any array of arrangement on a PC board. The lead crimping apparatus includes an interchangeable plate having positioned thereon a plurality of crimping elements arranged in accordance with the location of various electronics components on the PC board. The interchangeable plate is easily replaced thus allowing the lead crimping apparatus to be easily converted to accommodate virtually any electronic component arrangement on a PC board. The leads are engaged and crimped by various crimping elements which are displaced generally parallel to the plane of the PC board and transverse to the leads for more reliable crimping without the requirement for precise alignment between the component lead and crimping element. A fixed lower assembly and a vertically displaceable upper assembly allows the crimping apparatus to be positioned in a small space immediately below a PC board conveyor system in an arrangement which requires minimal space and allows the legs of a conveyor system operator to also be positioned beneath the conveyor. The absence of any structure between the generally flat interchangeable plate which engages the crimping elements and the crimping elements themselves allows for complete flexibility in the positioning of electronic components upon the PC board.

While particular embodiments of the present invention has been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for crimping leads or tabs of a plurality of electronic components positioned on a generally planar PC board, wherein said leads or tabs are positioned in apertures within and extend through said PC board, said apparatus comprising:

a pneumatically actuated lower assembly positioned beneath said PC board and including a slide member displaceable generally parallel to the plane of said PC board;

an upper assembly disposed between said PC board and said lower assembly and including first upper and second lower generally flat plates, wherein said first upper plate includes a plurality of crimping elements each positioned adjacent to at least one electronic component lead or tab and said second lower plate is engaged by a responsive to displacement of said slide member for engaging and displacing said crimping elements, whereupon each of said crimping elements engages at least one electronic component lead or tab in effecting the crimping thereof;

bearing means coupled to the lower portion of each of said crimping elements to facilitate displacement between said crimping elements and said second lower plate; and biasing means positioned between and engaging said first upper and second lower plate for urging said plates apart.

2. The apparatus of claim 1 wherein said lower assembly includes cam means mounted to said slide member and displaceable therewith for engaging and displacing said second lower plate.

3. The apparatus of claim 2 wherein said second lower plate includes roller means mounted thereto and adapted for engagement by said cam means for facilitating displacement of said second lower plate.

4. The apparatus of claim 3 wherein said cam means includes a plurality of cams positioned on an upper surface of said slide member in a spaced manner.

5. The apparatus of claim 1 further comprising alignment means coupled between said upper and lower assemblies for maintaining proper alignment, while allowing for relative displacement, therebetween.

6. The apparatus of claim 5 wherein said alignment means includes a plurality of rods coupled to said first upper plate and a plurality of bushings each mounted to said lower plate and adatped to receive a respective rod in sliding engagement.

7. The apparatus of claim 1 further comprising means coupled between first upper and second lower plates for maintaining proper alignment, while allowing for relative displacement, therebetween.

8. The apparatus of claim 7 wherein said alignment means includes a plurality of rods coupled to mounting brackets of said first upper plate and a plurality of bushings each mounted to said second lower plate and adapted to receive a respective rod in sliding engagement.

9. The apparatus of claim 1 further comprising a plurality of coupling means for coupling each of said crimping elements to said first upper plate in a pivoting manner.

10. The apparatus of claim 9 wherein each of said crimping elements includes an upper crimping portion, an intermediate portion pivotally couple to said first upper plate, and a lower portion engaged by said second lower plate.

11. The apparatus of claim 10 wherein said second lower plate and the lower portion of each of said crimping elements are displaced in a direction generally perpendicular to the plane of the PC board and the upper crimping portion of each of said crimping elements is displaced generally parallel to the plane of the PC board.

12. The apparatus of claim 1 further comprising biasing means for urging each of said crimping elements to a non-crimping position.

13. The apparatus of claim 1 further comprising removable connecting means for coupling said first upper plate to said upper assembly to facilitate removal of said first upper plate and its replacement by another upper plate having a different arrangement of crimping elements thereon.

14. The apparatus of claim 1 wherein said lower assembly further includes a base plate and bearing means disposed between said base plate and said slide member to facilitate relative displacement therebetween.

15. The apparatus of claim 1 further comprising a pneumatic cylinder coupled to said lower assembly for raising and lowering said lower assembly.

16. The apparatus of claim 1 further comprising at least one pneumatic cylinder coupled to said slide member for lineraly displacing said slide member in a direction generally parallel to the plane of said PC board.

17. A crimping mechanism for engaging and crimping a lead/tab of an electronic component positioned on a first side of a circuit board, wherein said lead/tab is positioned in an aperture in and extends through said circuit board to a second opposed side thereof, said crimping mechanism comprising:

a support structure;

a first pivot arm coupled to said support structure;

first means for urging said first pivot arm in a first direction of rotation;

actuation means movable between first and second positions for engaging and pivotally displacing said first pivot arm in a second opposed direction of rotation when moved from said first position to said second position and for disengaging and allowing said first pivot arm to be displaced by said first means in said first direction of rotation when moved from said second to said first position;

first roller means disposed on said first pivot arm and adapted for engagement by said actuation means to facilitate relative displacement between said pivot arm and said actuation means;

first biasing means disposed between and engaging said support structure and said actuation means for urging said actuation means from said second to said first position; and lead/tab engaging means coupled to said first pivot arm for engaging and crimping an electronic component lead/tab when said first pivot arm is displaced in said second direction of rotation.

18. The lead/tab crimping mechanism of claim 17 wherein said lead/tab engaging means comprises a crimping element pivotally mounted to said support structure.

19. The lead/tab crimping mechanism of claim 18, wherein said crimping element includes a slot for engaging and twisting a distal end of an electronic component lead/tab.

20. The lead/tab crimping mechanism of claim 19, wherein said support structure comprises a generally flat plate having an aperture within which said pivot arm is positioned.

21. The lead/tab crimping mechanism of claim 20 further comprising a pivot pin disposed within the aperture in said first flat plate and engaging said pivot arm.

22. The lead/tab crimping mechanism of claim 21 wherein said flat plate is positioned between the circuit board and said actuation means and wherein said actuation means is displaced toward said flat plate when moved from said first to said second position and is displaced away from said flat plate when moved from said second to said first position.

23. The lead/tab crimping mechanism of claim 22, wherein said pivot arm includes first and second ends, with said first end of said pivot arm engaging said crimping element and said second end of said pivot arm engaged by said actuation means.

24. The lead/tab crimping mechanism of claim 23 wherein said roller means is disposed on the second end of said pivot arm to facilitate relative displacement between said pivot arm and said actuation means.

25. The lead/tab crimping mechanism of claim 24, wherein said first means comprises a coiled spring.

26. The lead/tab crimping mechanism of claim 25, wherein said coiled spring is positioned between and in abutting contact with said support structure and said pivot arm.

27. The lead/tab crimping mechanism of claim 26, wherein said actuation means comprises a second generally flat plate.

28. The lead/tab crimping mechanism of claim 17 wherein said support structure comprises a first generally flat plate having a first aperture within which said pivot arm is positioned.

29. The lead/tab crimping mechanism of claim 28 further comprising a pivot pin disposed within the first aperture in said first flat plate and engaging said pivot arm.

30. The lead/tab crimping mechanism of claim 29, wherein said first flat plate is positioned between the circuit board and said actuation means and wherein said actuation means is displaced toward said first flat plate when moved from said first to said second position and is displaced away from said first flat plate when moved from said second to said first position.

31. The lead/tab crimping mechanism of claim 30 wherein said actuation means comprises in combination a second generally flat plate and plunger means inserted through a second aperture in said first flat plate for engaging and displacing said pivot arm.

32. The lead/tab crimping mechanism of claim 29, wherein said plunger means includes an elongated linear shaft having a first end in contact with said pivot arm and a second end in contact with said second flat plate.

33. The lead/tab crimping mechanism of claim 28, wherein said first means comprises a coiled spring disposed between and in contact with said first plate and said pivot arm.

34. The lead/tab crimping mechanism of claim 17 further comprising a second pivot arm coupled to said support structure adjacent to said first pivot arm and having a second lead/tab engaging means coupled to a respective first end thereof, wherein said second pivot arm is adapted for engagement and pivoting displacement by said actuation means.

35. The lead/tab crimping mechanism of claim 34, further comprising first and second pivot pins respectively coupling said first and second pivot arms to said support structure.

36. The lead/tab crimping mechanism of claim 34, wherein said first means is coupled to said first and second pivot arms for urging said pivot arms in first and second opposed directions of rotation.

37. The lead/tab crimping mechanism of claim 36, wherein said first means comprises a coiled spring disposed between and engaging said first and second pivot arms.

38. The lead/tab crimping mechanism of claim 36, wherein said first means comprises a stretchable, resilient band disposed between and engaging said first and second pivot arms.

39. The lead/tab crimping mechanism of claim 34 wherein each of said first and second pivot arms includes a respective second end adapted for engagement and displacement by said actuation means.

40. The lead/tab crimping mechanism of claim 39 further comprising second roller means disposed on the second end of said second pivot arm and engaged by said actuation means to facilitate relative displacement between said second pivot arm and said actuation means.

41. The lead/tab crimping mechanism of claim 40, wherein said actuation means includes a first generally flat plate movable between said first and second positions.

42. The lead/tab crimping mechanism of claim 17, wherein said support structure includes a generally flat plate having a slot within which is positioned said pivot arm and said lead/tab engaging means.

43. The lead/tab crimping mechanism of claim 42, further comprising a plurality of pivot pins for coupling said pivot arm and said lead/tab engaging means to said generally flat plate.

44. The lead/tab crimping mechanism of claim 43 wherein said lead/tab engaging means comprises a pair of crimping elements extending from said slot beyond a first surface of said plate and wherein said pivot arm extends from said slot beyond a second, opposed surface of said plate.

45. The lead/tab crimping mechanism of claim 44 further comprising biasing means for urging each of said crimping elements in opposite directions.

46. The lead/tab crimping mechanism of claim 45 wherein said biasing means comprises a resilient, stretchable band engaging each of said crimping elements.

* * * * *